United States Patent
Epstein et al.

(10) Patent No.: US 9,753,614 B2
(45) Date of Patent: *Sep. 5, 2017

(54) METHOD AND SYSTEM FOR CREATING AN ALTERNATIVE ENERGY VEHICLE SUPPLY STATION NETWORK

(71) Applicant: Lightening Energy, Dover, NJ (US)

(72) Inventors: Michael L. Epstein, Bedminster, NJ (US); Ryan McNellis, West Chester, PA (US); Greg Katz, Randolph, NJ (US); Christopher K. Dyer, Madison, NJ (US)

(73) Assignee: Lightening Energy, Dover, NJ (US)

( * ) Notice: Subject to any disclaimer, the term of this patent is extended or adjusted under 35 U.S.C. 154(b) by 692 days.

This patent is subject to a terminal disclaimer.

(21) Appl. No.: 14/012,928

(22) Filed: Aug. 28, 2013

(65) Prior Publication Data
US 2013/0346902 A1    Dec. 26, 2013

Related U.S. Application Data

(63) Continuation-in-part of application No. 13/327,231, filed on Dec. 15, 2011, now Pat. No. 8,914,260.

(60) Provisional application No. 61/856,937, filed on Jul. 22, 2013, provisional application No. 61/726,787, filed on Nov. 15, 2012.

(51) Int. Cl.
*G06F 17/50*    (2006.01)
*G06F 3/0484*    (2013.01)
*B60L 11/18*    (2006.01)

(52) U.S. Cl.
CPC ........ *G06F 3/0484* (2013.01); *B60L 11/1824* (2013.01); *G06F 17/509* (2013.01); *Y02T 10/7005* (2013.01); *Y02T 10/7072* (2013.01); *Y02T 90/12* (2013.01); *Y02T 90/121* (2013.01); *Y02T 90/14* (2013.01)

(58) Field of Classification Search
CPC .. G06F 3/0484; G06F 17/509; B60L 11/1824; Y02T 10/7072; Y02T 90/121; Y02T 90/14; Y02T 10/7005; Y02T 90/12
USPC ............................................................. 703/1
See application file for complete search history.

(56) References Cited

U.S. PATENT DOCUMENTS

| | | |
|---|---|---|
| 8,498,886 B2 | 7/2013 | Epstein et al. |
| 2009/0082957 A1* | 3/2009 | Agassi ............ B60L 3/12 701/532 |
| 2012/0221299 A1 | 8/2012 | Epstein et al. |

* cited by examiner

*Primary Examiner* — Saif Alhija
(74) *Attorney, Agent, or Firm* — Davidson, Davidson & Kappel, LLC

(57) ABSTRACT

A computer implemented method for creating an alternative energy vehicle supply station network is provided. The method includes displaying selectable potential alternative energy vehicle supply stations to users via a graphical user interface displayed on remote devices, the potential alternative energy vehicle supply stations being selectable by each of the users of remote devices to submit at least one preference of each user as a user submission; updating a memory of a computer to include the user submissions; processing, by a processor of the computer, the user submissions as a function of preselected criteria; and outputting, by the computer, the potential alternative energy vehicle supply stations satisfying the preselected criteria.

7 Claims, 6 Drawing Sheets

US 9,753,614 B2

METHOD AND SYSTEM FOR CREATING AN ALTERNATIVE ENERGY VEHICLE SUPPLY STATION NETWORK

This claims the benefit to U.S. Provisional Patent Application No. 61/856,937, filed on Jul. 22, 2013, U.S. Provisional Patent Application No. 61/726,787, filed on Nov. 15, 2012 and U.S. patent application Ser. No. 13/327,231, filed Dec. 15, 2011, all of which are hereby incorporated by reference herein.

BACKGROUND

Alternative energy vehicle supply stations are known. A network of electric vehicle (EV) recharging stations has begun to be established in various parts of the world. For example, Tesla Motors has developed a fast DC recharger network in California.

Typical chargers for electric vehicles, including hybrid electric vehicles, include Level 1, Level II and fast DC rechargers, which typically will use either a CHAdeMo or SAE J1772 standard.

Additionally, compressed natural gas (CNG) or liquid natural gas (LNG) vehicles are already in use, and liquid propane vehicles are also known. Natural gas vehicles are typically used in bus fleets or areas where compressed or liquid natural gas fueling stations are operated by a central operator. Honda now offers natural gas vehicles and they are in wide use worldwide. The term alternate fuel as used herein refers to CNG, LNG propane, primarily ethanol and all non-gasoline and diesel fueling stations.

SUMMARY OF THE INVENTION

The logistics of creating and operating an alternative energy vehicle supply station network that meets the needs of a certain alternative energy vehicle owner community is difficult, and creating such a network from the "top down" is, in the view of the present inventors, difficult.

The present invention envisions creating an alternative energy vehicle supply station network from the "bottom up" and provides a system and method for creating such a network.

The present invention provides a computer implemented method for creating an alternative energy vehicle supply station network. The method includes displaying selectable potential alternative energy vehicle supply stations to users via a graphical user interface displayed on remote devices, the potential alternative energy vehicle supply stations being selectable by each of the users of remote devices to submit at least one preference of each user as a user submission; updating a memory of a computer to include the user submissions; processing, by a processor of the computer, the user submissions as a function of preselected criteria; and outputting, by the computer, the potential alternative energy vehicle supply stations satisfying the preselected criteria.

A method for creating an alternative energy vehicle supply station network is also provided. The method includes displaying selectable potential alternative energy vehicle supply stations on to users via graphical user interfaces displayed on remote devices, the potential alternative energy vehicle supply stations being selectable by each of the users of remote devices to submit at least one preference of each user as a user submission; updating a memory of a computer to include the user submissions; processing, by a processor of the computer, the user submissions as a function of preselected criteria; outputting, by the computer, the potential alternative energy vehicle supply stations satisfying the preselected criteria; and constructing at least one of the outputted potential alternative energy supply stations.

A computer system for creating an alternative energy vehicle supply station network is also provided. The computer system includes a computer readable memory storing program instructions and a processor to execute the program instructions via the computer readable memory. The program instructions generate a graphical user interface and, responsive to user selection of representations on the graphical user interface representing potential alternative energy vehicle supply stations on the graphical user interface and user submission of the user selections, record the user preferences on the computer-readable memory. The program instructions also retrieve the user submissions from the computer-readable memory and process the user submissions as a function of preselected criteria to determine which of the potential alternative energy vehicle supply stations are optimal for construction. The program instructions further output the potential alternative energy vehicle supply stations satisfying the preselected criteria via the graphical user interface or another graphical user interface.

A computer program product, disposed on a non-transitory computer readable media, is also provided. The product includes computer executable process steps operable to control a computer to display selectable potential alternative energy vehicle supply stations on to users via graphical user interfaces displayed on remote devices, the potential alternative energy vehicle supply stations being selectable by each of the users of remote devices to submit at least one preference of each user as a user submission; update a record to include the user submissions; process the user submissions as a function of preselected criteria; and output the potential alternative energy vehicle supply stations satisfying the preselected criteria.

BRIEF DESCRIPTION OF THE DRAWINGS

Embodiment of the method and system of the present invention may be further described using the following drawings, in which:

FIGS. 2a to 2c show a graphical user interface in accordance with an embodiment of the present invention displaying a map including icons representing existing alternative energy vehicle supply stations and icons representing potential alternative energy vehicle supply stations;

DETAILED DESCRIPTION OF THE PREFERRED EMBODIMENT

Figure 1:
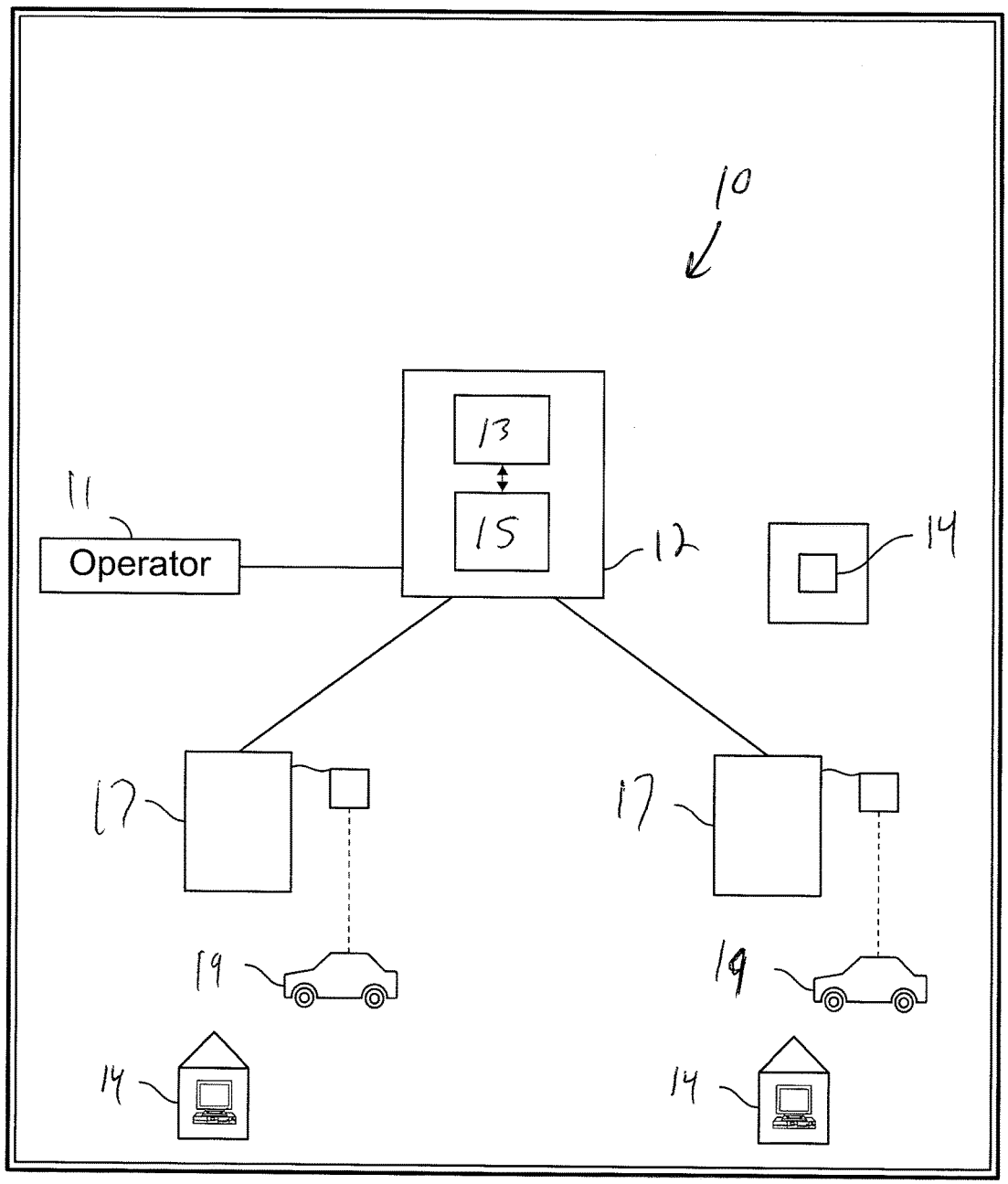
FIG. 1 shows a computer system for creating an alternative energy vehicle supply station network in accordance with an embodiment of the present invention.

FIG. 1 shows a computer system 10 for creating an alternative energy vehicle supply station network in accordance with an embodiment of the present invention. As used herein an alternative energy vehicle supply station network is a plurality of stations that allows drivers of vehicles that are propelled by an on-board energy alternative supplying device, that is an on-board energy supplying device other than a gasoline or diesel powered engine, to resupply the energy source of the energy supplying device used to propel the vehicle. One example of an alternative energy vehicle supply station is an electric vehicle battery recharging station, which recharges the electric battery used to power the electric motor for propelling the electric vehicle. Other examples of an alternative energy vehicle supply stations are alternate fuel supply stations, such as a compressed natural gas supply station, a liquid natural gas supply station or a liquid propane supply station, which refuel the respective compressed natural gas, liquid natural gas or liquid propane used to power the engine or motor propelling the vehicle.

Computer system 10 includes at least one computer 12, in the form of at least one server for interacting with clients 14, which may be in the form of a plurality of remote devices 14, each having a display for displaying a graphical user interface (GUI), via the internet. Server 12 may include a memory 13 and a processor 15. Server 12 may be controlled by a computer program product stored on a non-transitory computer readable media, which may be in memory 13 or an external storage device. The computer program product may include computer executable process steps operable to control server 12 in accordance with the embodiments of method described below for creating an alternative energy vehicle supply station network. Remote devices 14 may be any device capable of interacting as a client with server 12, for example a home computer, cell phone with web capabilities, or tablet, connected for example via a TCP/IP protocol to server 12. Remote devices 14 can be used as described below to create actual alternative energy vehicle supply stations 17 for resupplying alternative energy vehicles 19.

Server 12 hosts a website and/or software application accessible by users of remote devices 14 who are interested in generating or expanding an alternative energy vehicle supply station network in a geographical area where the users live and/or work and/or travel frequently. For one example, a first user may own an electric vehicle, but is not satisfied with the number of publicly accessible fast recharging stations in a particular geographical area. The particular area may be along a route to work or within a certain distance from the first user's home. For another example, a second user may be interested in purchasing an electric vehicle, but is not satisfied with the number of publicly accessible fast recharging stations in a particular geographical area. The particular area may be along a route the second user travels on a weekly basis to visit a relative. The route may be too great of a distance for the second user to travel without recharging the electric vehicle and the second user may not be willing to purchase an electric vehicle unless a fast recharging station is built along the route.

An operator 11 of server 12 may first compile a record of potential stations. In a preferred embodiment, the record of potential stations may include physical sites that may be potentially usable for constructing an alternative energy vehicle supply station. The record may be compiled by identifying available commercial real estate (for lease or sale) in close proximity to thoroughfares having at least a predetermined rate of traffic. The potential stations may be chosen by taking into account existing alternative energy vehicle supply stations. For example, potential stations that are too close to existing alternative energy vehicle supply stations may be excluded from the record. The record may include the location (e.g., address and/or geographical coordinates) of each physical site and the total cost estimate for constructing an alternative energy vehicle supply station at each physical site. The total cost estimate may include a cost estimate to obtain (buy or lease) the physical site and a cost estimate of building the alternative energy vehicle supply station on the physical site. An estimate of taxes and a cost estimate of running and servicing the alternative energy vehicle supply station over a certain time period may also be stored in the record. The record may be input into server 12 by the operator or a computer program or may be compiled by a computer program run by server 12. The record may be stored in memory 13 of server 12. In another embodiment, the record of potential stations may include areas where potential stations may be constructed. For example, the record may include the location as a neighborhood of city, such as the Upper West Side of Manhattan.

The locations of the potential physical sites may then be accessed from server 12 and graphically displayed by server 12 on a GUI on displays of remote devices 14 as an interactive map to users of the remote devices 14 via the internet. The map may be generated using a mapping application created with an Application Programming Interface (API), such as for example GOOGLE MAPS API (suitable for use with web browsers), or a Software Development Kit (SDK), such as for example GOOGLE MAPS SDK for iOS (suitable for use with iOS applications). The record of potential physical sites may be input into the mapping application so the potential sites are displayable on the GUIs on displays of the remote devices 14 via the internet. A user of one of the remote devices may access the interactive map via the software application and/or the website hosted on server 12, which may first generate an input section of the GUI prompting the user of the remote device 14 to enter geographical information. The geographical information may include location information, which may include one or more general or specific addresses, or route information, which may include one or more general or specific routes. Server 12 may also automatically obtain geographical information by accessing GPS or IP address information regarding the remote device 14.

First time users may establish an account profile by creating a username and password. The account profile may also include preferred contact information, which may include an email address, telephone number or social media account profile (e.g., FACEBOOK account information). Personal information, such as name and demographic information may also be entered into the account profile. A user may also enter geographical information to be stored in the profile so that returning users do not have to enter geographical information each time a user seeks to enter the user's preferences.

The user of the remote device 14 may also input information regarding the alternative energy vehicle the user intends to resupply at the alternative energy supply station(s). For example, certain electric vehicles include batteries that are not capable of being charged above a certain rate without risking damage to the battery. Also, electric vehicles generally include charging receptacles that are only compatible with a certain type of charging plug. A user can input the information regarding the electric vehicles so that only sites intended to have electric vehicle charging stations having a charging rate and charging plug compatible with the entered electrical vehicle information are displayed to the user. For another example, the user may enter what type of natural gas vehicle the user intends to resupply at the alternative energy supply station(s). A user can input the information regarding the natural gas vehicles so that only sites intended to have natural gas compatible with the entered natural gas vehicle information are displayed to the user.

The geographical information may be processed by processor 15 of server 12, which then generates a plurality of potential stations as a function of the geographical information. If the user inputs vehicle, this information is also used to generate the plurality of potential stations, by excluding alternative energy supply stations that are incompatible with the entered vehicle information. Server 12 may generate representations of potential stations within a predetermined distance from the address or route entered by the user of the remote device 14. Server 12 may then display the representations of potential stations to the GUI displayed on the remote device 14. Server 12 may automatically generate representations of potential stations on an interactive map. The representation may represent a specific address or a general area. In a preferred embodiment, the representations are generated as icons on a map. In another embodiment, the representations of potential stations may be displayed as text on a GUI. Additionally, server 12 may automatically generate and display existing alternative energy vehicle supply stations surrounding the generated potential stations as icons that are distinct from the icons representing potential stations, for example as icons of a different color. The user of the remote device 14 may enter the user's preferences for sites to the user would like to see be built into alternative energy vehicle supply station by selecting icons representing potential stations on the GUI. The icons may be selected for example by clicking on the icons with a mouse or touchpad if the remote device 14 is a desktop or laptop computer or by touching the GUI at the location of an icon if the remote device 14 is a smart phone or tablet laptop computer. The selection of the icons may visually modify the icon, for example by changing the color of the icon. After the user of the remote device 14 has completed selecting icons representing potential stations the user may submit the sites as preferences to the server or may save the selections for updating and later submission. The preferences may be submitted by selecting a submit preferences icon on the GUI on the remote device 14.

Figure 2A:
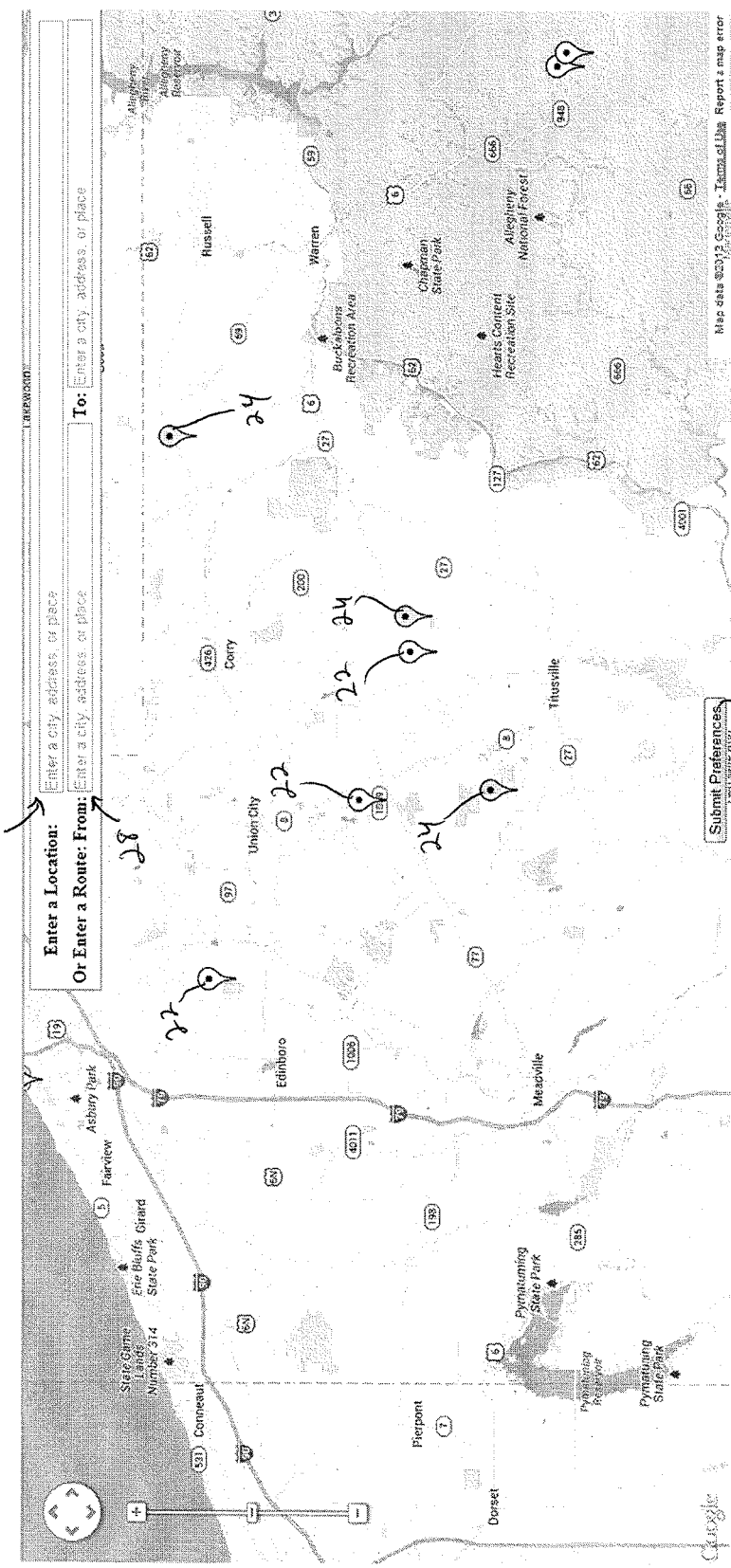

FIG. 2a shows a GUI 20 in accordance with an embodiment of the present invention displaying a map including icons representing existing alternative energy vehicle supply stations 22 and icons representing potential alternative energy vehicle supply stations 24. GUI 20 includes a location field 26 for entering location information and a route field 28 for entering route information (i.e., start location and end location). The location information and route information may include a traditional address (e.g., number and street with town and state and/or zip code), geographical coordinates (e.g., latitude and longitude), a site name (e.g., Drew University) or a general zone (e.g., Foggy Bottom, Washington D.C.). After the user enters and submits geographical information, in the form of location information or route information, the icons representing existing alternative energy vehicle supply stations 22 and icons representing potential alternative energy vehicle supply stations 24 in the geographical area of the entered geographical information are displayed on GUI 20. The user may then select the icons representing potential alternative energy vehicle supply stations 24 the user is interested in using and submit these to server 12 by selecting a submit preferences button 30 on GUI 20. When submit preferences icon 30 is selected, server 12 transfers the user preferences to memory 13, in the form of a file, for example an excel file or a text file, for further use.

FIG. 2b shows an example of a user entering location information into location field 26. A user entered Drew University into location field 26 and server 12 modified GUI 20 to generate a location icon 32 identifying Drew University, icons representing existing alternative energy vehicle supply stations 22 and icons representing potential alternative energy vehicle supply stations 24.

Figure 2C:
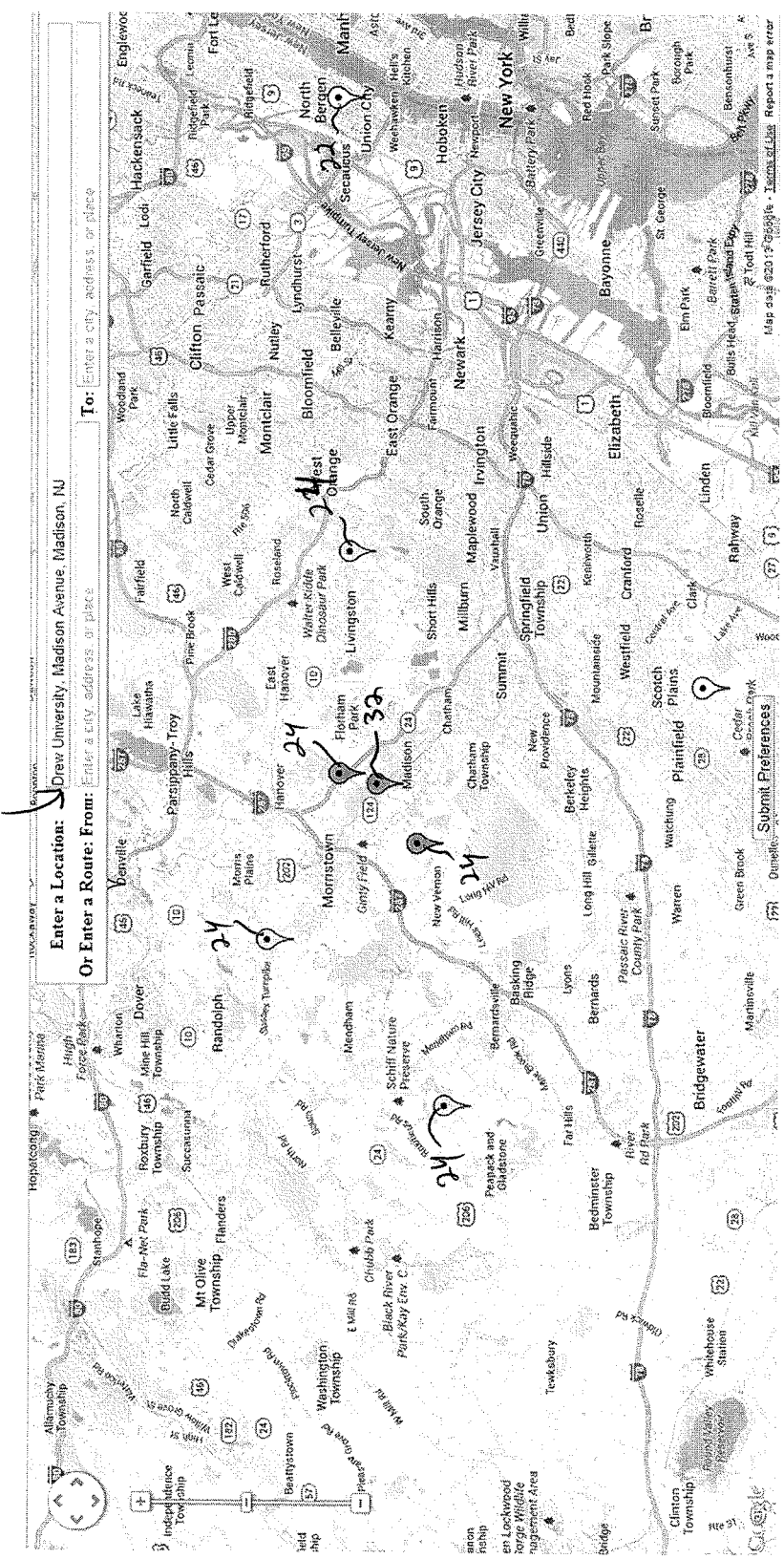
Figure 2C:
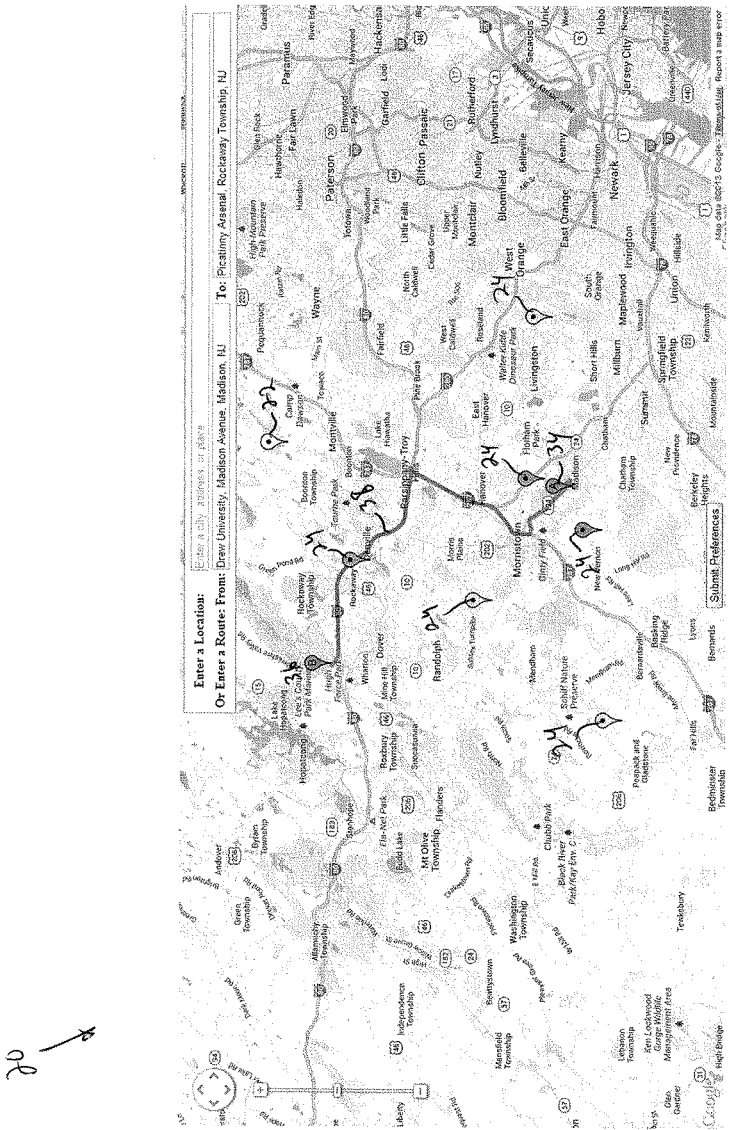

FIG. 2c shows an example of a user entering location information into route field 28. A user entered Drew University as a starting location and Picatinny Arsenal as an ending location into route field 28 and server 12 generated a starting location icon 34 identifying Drew University, an ending location icon 36 identifying Picatinny Arsenal, a route icon 38, icons representing existing alternative energy vehicle supply stations 22 and icons representing potential alternative energy vehicle supply stations 24. The darker color of some of icons 24, compared to others of icons 24, indicates that the user has selected the stations represented by icons 24 as user preferences, which are submitted by selection submit preferences icon 30.

The submitted preferences are transmitted to server 12 via the internet. Server 12 then receives the submitted preferences and may store the submitted preference in memory 13 of server 12. The processor 15 of server 12 may count each submitted preference. The processor 15 of server 12 may also assign each submitted preference to a geographical section. The geographical section may be based on the selected potential stations. In one preferred embodiment, when a total number of submitted preferences reach a preset limit, the processor 15 of server 12 then processes the user submissions as a function of preselected criteria. In another embodiment, the processor 15 of server 12 processes the user submissions as a function of preselected criteria after a preset amount of time has passed or as instructed manually by the operator of server 12. The preset limit may be for a particular geographical section. For example, processor 15 may carry out a mathematical model programmed to include the preselected criteria, using the submitted preferences as inputs, to output the potential stations satisfying the preselected criteria. In a preferred embodiment, the mathematical model selects an optimal number of the potential alternative energy stations that are to be created to extend or generate an alternative energy vehicle supply station network consistent with user demand.

The mathematical model may be programmed with preselected criteria chosen to select at least one of an optimal number of the potential alternative energy vehicle supply stations to satisfy all the users that submitted preferences, an optimal number of the potential alternative energy vehicle supply stations to minimize costs of the construction of the potential alternative energy vehicle supply stations and an optimal number of the potential alternative energy vehicle supply stations to maximize a driving range of the users.

In one preferred embodiment, a user is satisfied if the model selects at least one of the preferred potential stations submitted by each user is chosen by the model. The problem of choosing at least one preferred station for each user may be defined as a binary integer programming problem and may be solved by an integer program solver. One integer program solver for solving the problem may be defined by the following:

I=set of electric vehicle owners, J=set of potential stations.

Variables:

$b_j$ is a binary variable that equals 1 if we should construct the jth potential station and 0 otherwise.

Constants (Inputs):

$c_j$ is the cost of constructing the jth potential station;

$d_{i,j}$ equals 1 if user i would be willing to go to station j and equals 0 otherwise.

$$\min \Sigma_{j \in J} c_j b_j$$

subject to constraints:
1. $b_j \in \{0, 1\} \forall j \in J$
2. $\Sigma_{j \in J} d_{i,j} b_j \geq 1 \forall I \in I$ The integer problem solver defined above thus takes into account the user preferences and costs of constructing the potential stations. If all potential stations have the same construction costs, then the model chooses the minimum number of potential stations to be constructed such that each user is satisfied. If stations have different constructions costs, then the model chooses stations to minimize the total cost of construction while simultaneously making sure each user is satisfied.

In another embodiment, the processor 15 of server 12 may carry out a distance model, which may receive inputs (for example as text files) and minimize the cost and number of stations being built such that every user has at least one station within a specified distance. The model chooses a minimal number of stations to satisfy every user's preferences to make the construction costs as low as possible. The inputs are (1) geographical information in the form of x and y coordinates of the residence of each user, (2) distance information in the form of a radius each user is willing to drive as input by the users from the user's residence to use an alternative energy vehicle supply station, (3) potential station location information in the form of x and y coordinates of the each potential station, and (4) potential station cost information including the total costs of constructing each potential station. It is assumed in this model that the user would be willing to support any potential station built within the radius the user input and would be unwilling to support any station built outside of the radius the user input. In one preferred embodiment, the geographical information and the distance information are stored in a first text file and the potential station location information and the potential station cost information are stored in a second text file. The information in the first and second text files may then be placed into arrays. The distance model may then perform the above integer program solver and return a station set array. A station set array is a 2-D array that for 1 people and J potential stations, shows whether the ith user will be satisfied by the jth station. A user is satisfied only if the station is being constructed and is within the user's radius.

Figure 3:
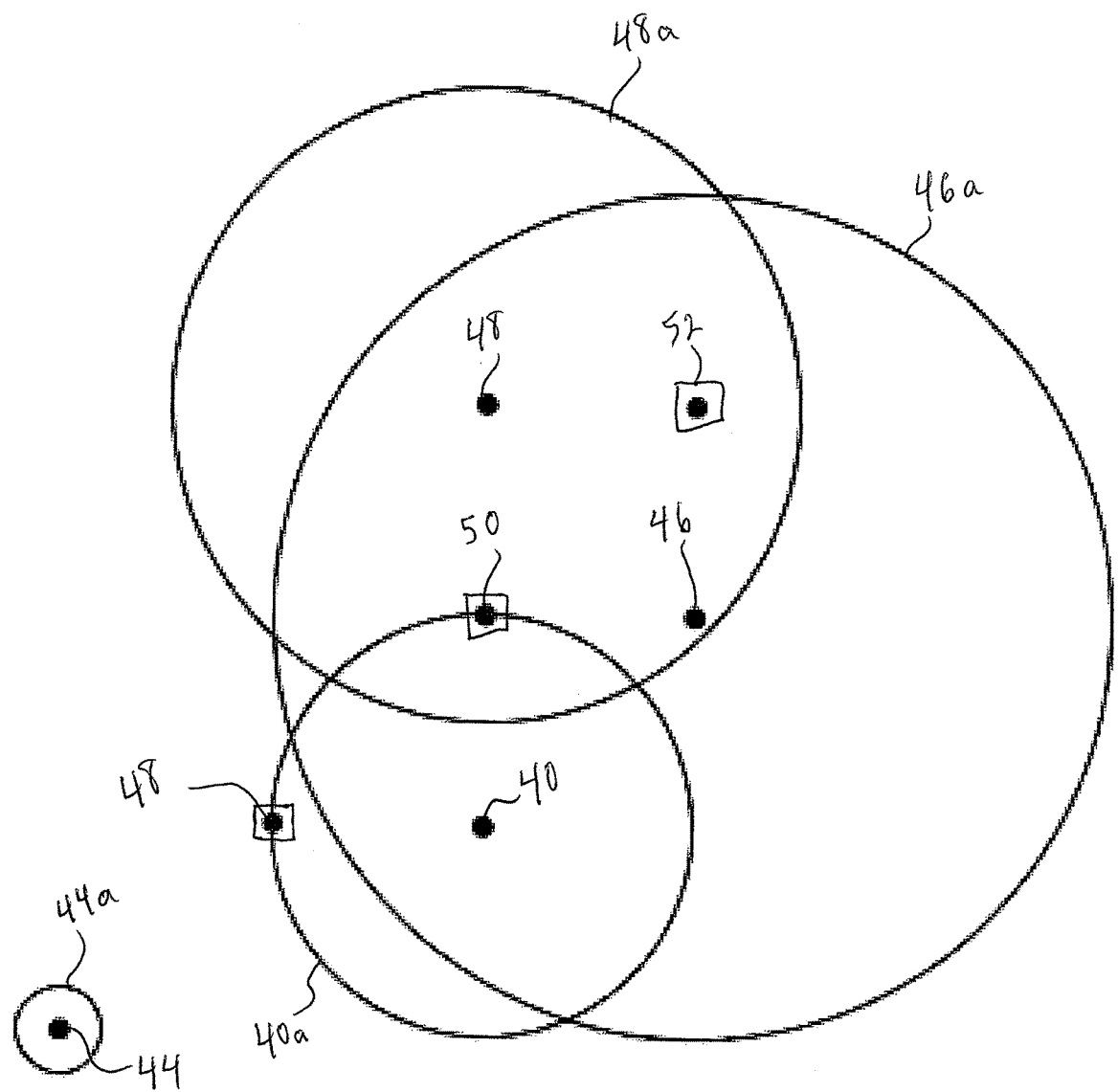
FIG. 3 shows an example of a graphical depiction of four users and three potential stations used as inputs to a model in accordance with an embodiment of the present invention.

FIG. 3 shows an example of a graphical depiction of four users and three potential stations used as input to the distance model in accordance with an embodiment of the present invention. A first user 40 has a location defined by x,y coordinates and a boundary 40a defining a distance user 40 is willing to travel to use a potential station, a second user 42 has a location defined by x,y coordinates and a boundary 42a defining a distance user 42 is willing to travel to use a potential station, a third user 44 has a location defined by x,y coordinates and a boundary 44a defining a distance user 44 is willing to travel to use a potential station and a fourth user 46 has a location defined by x,y coordinates and a boundary 46a defining a distance user 46 is willing to travel to use a potential station. Three potential stations 48, 50, 52 are located within the geographical area near users 40, 42, 44, 46. In this example, stations 48, 50, 52 all have the same total construction cost. Potential station 48 is located within boundary 40a, but is outside of boundaries 42a, 44a, 46a and potential station 52 is located within boundaries 42a, 46a, but is outside of boundaries 40a, 44a. Potential station 50 is located within boundaries 40a, 42a, 46a, but is outside of boundary 44a. Because potential station 50 satisfies the most users, the distance model would thus selected potential station 50 and server 12 would output this selection to users 40, 42, 44, 46. If stations 48, 50, 52 do not have the same total construction costs, the selection of the distance model may be different. The distance model will then use the cost information to determine which station 48, 50, 52 would most economically satisfy all the users that can be satisfied as a function of the user preferences. Further to the above example, if station 48 has a total construction cost of station of $10 k, station 50 has a total construction cost of $100 k and station 52 has a total construction cost of $30 k, the distance model will select station 48 and station 52 as selecting these stations will satisfy the maximum number of users (40,42 and 46) at the lowest possible cost of construction (station 48=$10 k/user, station 50=$33.3 k/user, station 52=$15 k/user).

In other embodiments, the model may take into account other variables. Range may be taken into consideration by selecting potential stations that connect to each other to cover the widest possible range. For example if each station recharges electric vehicles to give the electric vehicles 50 miles of range, the model may place two sites about 45 miles away from each other along a travel route to increase the range of electric vehicles along the travel route to over 100 miles. Driver accessibility may be taken into consideration on some routes by selecting potential stations on a side of the road that is more easily accessible to drivers (e.g., commuters may prefer to resupply after work, so the homebound traffic side of the road may be more advantageous and profitable). Profitability parameters may be taken into consideration for example by selecting sites that are estimated by have the greatest odds of at least breaking even. Performance compatibility between the potential station and the vehicle information which may be submitted by the user, including recharge rate and interoperability, may also be taken into consideration. Because not all electric vehicle recharging stations are rapid recharge stations and not all electric vehicles chargers can charge all electric vehicles, special plugs are necessary so some stations may not be able to charge certain electric vehicles. Accordingly, performance compatibility may be taken into consideration to satisfy a maximum amount of users. Grid compatibility/balance may also be taken into consideration so that the charging stations do not overload the grid and cause blackouts.

After the processor 15 of server 12 runs the corresponding model, server 12 outputs a notification informing the user of the remote device 14 that result information regarding the user's preferences submission is available for viewing. The results information includes the selected potential stations relevant to the corresponding user selected by the model to users of remote devices 14. The results information may be sent by server 12 to the user's preferred contact. In one preferred embodiment, the results information is emailed to each user. The results information may additionally or alternatively be sent by a software application on one of the remote devices. For example, a smartphone application may send the user of the smartphone a push notification that the results information is available. The results information may be limited to selected potential stations chosen by the model from the preferred stations submitted by the user to server 12. For example, if a user selected five preferred stations out of twenty total potential stations and three of those five stations were selected by the model, the result information sent to the user is only related to the three selected stations. The results information may include the location of the selected stations, the total costs for constructing each of the selected stations and the number of potential users for each of the selected stations. Potential users are defined as other users that submitted preferences including the selected station.

In other embodiments, the results information may be related to all of the potential stations offered to the user for selection by server 12 within the prescribed geographical area. For example, if a user selected five preferred stations out of twenty total potential stations and three of those five stations were selected by the model, but ten of the twenty total potential stations were selected by the model, the result information sent to the user may relate to the ten selected stations.

The results information may be included in the notification informing the user of the remote device 14 that the result information is available or may be accessed by the user via the website or software application hosted by server 12. The notification may include a password protected link such that the results information may be accessed by entering the user's username and password.

The results information may include a commitment section generated by server 12 offering the user an opportunity to make a commitment regarding one or more of the selected potential stations. For example, a GUI displaying the results information may include a commitment section for the user to submit commitment information, which as further described below may include an investment or other commitment, or may include a link to a webpage or software application including the commitment section. The commitment section may display the selected potential stations on a map or as a list and may be selectable by the user for submission of a commitment. A user may enter bank information to submit the commitment to the operator of server 12 or may submit a payment through a third party e-commerce business, such as PAYPAL, according to terms generated by server 12.

The commitment information may include investment information, such as a share price for each selected potential station and a number of shares for each selected potential station. The share price and the number of shares may be determined by the number of potential users for the selected potential station and the total estimated cost of construction for the selected potential station such that, if all shares have been purchased, all total estimated costs of construction of the station are funded. Users may then purchase as many or as little shares for the selected potential stations as desired.

In one preferred embodiment, the operator of server 12 indirectly or directly creates the selected potential sites chosen by the model. For example, if the model selects three potential stations in New Paltz, the operator obtains (buys or leases) the physical site for each station and physically constructs the alternative energy vehicle supply station on the physical site. The constructed stations may then be opened for use by the public or may be reserved for use by a private group of users. In one embodiment, the alternative energy vehicle supply stations may only be used by committed users. For example, each committed user may be restricted to use only the particular station to which the committed user made a commitment, or each committed user may use any of the stations operated in the station network established by the operator of the server.

The construction of the stations by the operator of server 12 may be independent of the level of investment by the users or may be dependent on the level of investment by the users. In one embodiment, the creation of the stations may be financed by private or public investment, without offering the users an opportunity to invest in the stations. In this embodiment, the submission of preferences by the users is used estimate consumer demand with respect to the potential stations, but is not used to solicit investment by the users. In another embodiment, the stations may not be created until an amount of investment by the users reaches a predetermined threshold. The predetermined threshold for the amount of investment may be the total cost estimate for constructing the alternative energy vehicle supply station or a percentage of the total cost estimate.

Accordingly, computer system 10 is programmed to generate a GUI and to process inputs from the GUI to establish an alternative energy vehicle supply station network. Computer-readable memory 13 stores program instructions and processor 15 executes the program instructions via computer-readable memory 13. The program instructions generate the GUI and, responsive to user selection of icons on the GUI representing potential alternative energy vehicle supply stations on the GUI and user submission of the user preference selections, record the user preferences on memory 13. The program instructions also retrieve the user submissions from memory 13 and process the user submissions as a function of preselected criteria to determine which of the potential alternative energy vehicle supply stations are optimal for construction. The program instructions output the potential alternative energy vehicle supply stations satisfying the preselected criteria via the GUI or another GUI.

Figure 4:
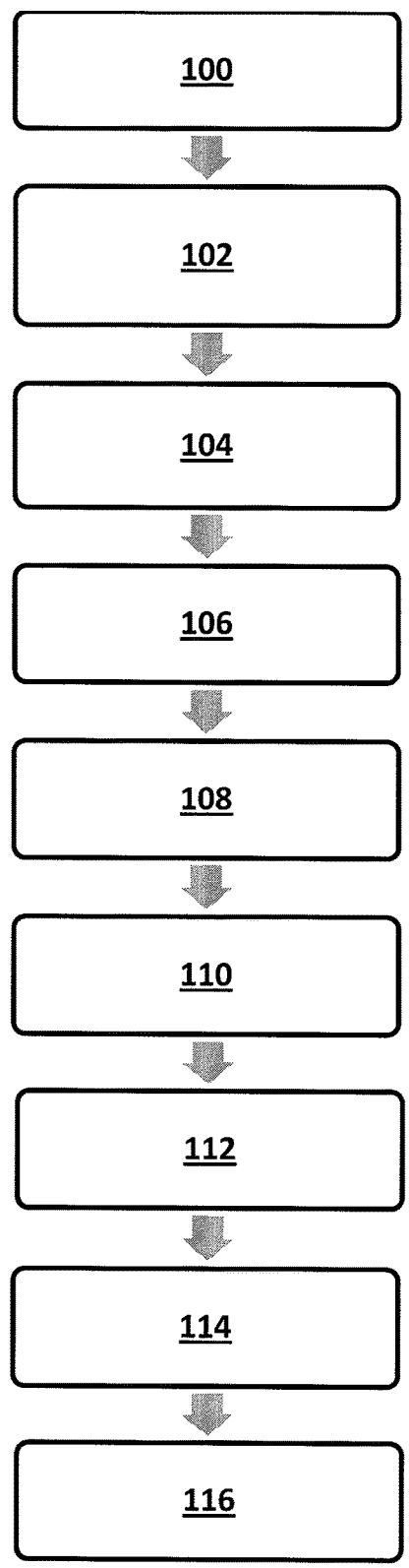
FIG. 4 shows a flow chart of a method according to an embodiment of the present invention.

FIG. 4 shows a flow chart illustrating a method for creating an alternative energy vehicle supply station network in accordance with a first embodiment of the present invention implemented by server 12 of computer system 10 described above. While the method is described below in a relation to a single server 12, it should be understood that multiple servers 12 may be used in parallel, or with different servers 12 performing different steps of the method. In a step 100, server 12 receives a request from one of remote devices 14 to display a geographic input section of a GUI. The geographic input section prompts the user of the remote device 14 to input geographical information. The GUI may be provided by a website or a software application, in particular a mobile application, and the user of the remote device 14 may request server 12 to display the geographical input section of the GUI by requesting a URL, by opening the software application or by making a selection in the software application. In a step 102, in response to the request in step 100, server 12 then displays the geographical input section of the GUI on the display of remote device 14 to prompt the user of remote device 14 to input geographical information. The geographical input section of the GUI may include location field 26 and route field 28 shown in FIG. 2*a*.

In a step 104, server 12 receives geographical information input by the user of the remote device 14. The geographical information includes location information and/or route information related to the user's use or potential use of an alternative energy vehicle supply station. The location information may include the user's home or work address, which may be considered a hub for the user's alternative energy vehicle use, and the route information may include a route the user commonly travels or intends to travel using an alternative energy vehicle.

In a step 106, server 12 processes the geographical information and generates a user specific record of potential alternative vehicle supply stations as a function of the geographical information. Server 12 compares the geographical information to information of potential alternative vehicle supply stations by accessing a potential station record of the information of the potential alternative energy vehicle supply stations from memory 13 of server 12. The potential station record may include location information (e.g., address and/or geographical coordinates) of each potential physical site and the total cost estimate for constructing an alternative energy vehicle supply station at each physical site. Server 12 then identifies potential alternative vehicle supply stations in a geographical area corresponding to the entered geographical information. The potential alternative vehicles may be identified by retrieving all of the potential alternative vehicle supply stations in the potential station record that are a predetermined distance, for example twenty miles, from the location and/or route in the geographical information.

In a step 108, server 12 then displays the potential alternative vehicle supply stations from the user specific record. In a preferred embodiment, the user specific potential stations are displayed on the display of remote device 14 on a potential station section of GUI in the form of an interactive map, such as for example the map shown in FIGS. 2a to 2c. As illustrated in FIGS. 2a to 2c, the GUI may display the map with geographic input section, and server 12 modifies the interactive map to illustrate representations of the potential stations. The map may include icons representing the user specific potential stations, which the potential station GUI displayed by server 12 prompts the user to select to indicate the user's potential station preferences, which denotes which of the user specific potential stations the user is willing to use. The potential station GUI may be configured such that icons change color as they are selected by the user. After the user is finished with the selection of the user's potential station preferences, the user submits them as a user preference submission to server 12, by for example hitting the submit preferences button 30 shown in FIG. 2a.

In a step 110, server 12 receives the user preference submission and then, in a step 112, stores the user preference submission in a submitted preferences record in memory 13 of server 12. Server 12 identifies the geographical area of the user preference submission and stores the user preference submission by its geographical area. For example, the submitted preferences record may include a plurality of geographical subrecords, each including record of a geographical area defined by server 12. Server 12 then repeats steps 100 to 110 with a plurality of remote devices 14 and stores user preference submissions from a plurality of users in a submitted preferences record in the memory 13 of server 12.

In a step 112, once the number of user preference submissions reaches a predetermined value, server 12 retrieves the user preference submissions from the memory 13 of server 12 and the processor 15 of server 12 processes the user preference submissions as a function of preselected criteria. Step 112 may include running the user preference submissions through a model that selects one or more of the potential alternative vehicle supply stations as being optimal for construction based on the user preference submissions. The model may be one of the models discussed above. Step 112 may take into consideration the geographical area of each user preference submission. For example, each geographical subrecord may be treated independently of the others, such that server 12 retrieves the user preference submissions from a first geographical subrecord from the memory 13 of server 12 and runs the user preference submissions through a model when the number submissions in the first geographical subrecord reaches a predetermined value.

In a step 114, server 12 outputs the selected potential alternative energy vehicle supply stations satisfying the preselected criteria. Step 114 may include sending the results of the model to the users of the remote devices 14 via a preferred contact or sending a notification to the user via the preferred contact indicating that the results are available on the website or software application that the user submitted the user preference submission. The notification may also include a link for accessing the potential station results output by server 12. The potential station results may be displayed on a results GUI, which may be the form of an interactive map.

Step 114 may also include outputting investment information from server 12 regarding the selected potential stations. The investment information may be displayed on the results GUI and may include offers for the user to purchase ownership shares of one or more of the potential stations selected from the user's preference submission by server 12 for the user. As noted above, the investment information may include a share price for each selected potential station and a number of shares for each selected potential station. The share price and the number of shares may be determined by the number of potential users for the selected potential station and the total estimated cost of construction for the selected potential station such that, if all shares have been purchased, all total estimated costs of construction of the station are funded. Users may then make a commitment to purchase as many or as little shares for the selected potential stations as desired. The results GUI, or another GUI displayed by server 12 that is accessible via the results GUI, may include one or more fields for receiving commitment information from users via remote devices 14 including a commitment from the user to purchase an ownership share in one or more of the selected potential stations. The commitment information may be submitted to server 12 by remote devices 14 via the GUI. The commitment may be in the form of an actual payment, in full or in a down payment with terms of a future payment or installments, or a binding contractual agreement. The binding contractual agreement may be unconditional, or it may be conditioned on commitments to invest in the selected potential station for which the user has tendered a commitment to reach a predetermined threshold. For example, if the construction costs for a potential station are estimated to be $100 k, a user can agree to invest $10 k in the potential station, with the investment being conditioned on the additional $90 k being committed by a set date. The commitment information may also include a commitment by the user to use the potential station at least a minimum number of times or to user the potential station for at least a minimum term. For example, a user may enter a binding contractual agreement to recharge the user's electric vehicle at a potential recharging station fifty times or to recharge the user's electric vehicle at a potential recharging station for four years. The user may commit to paying a predetermined fee if the user fails to meet these minimum requirements.

In a step 116, server 12 receives the commitment information submitted by the users from remote devices 14 and stores the commitment information in a commitment record in the memory 13 of server 12. The commitment record may include a plurality of subrecords, each including the commitments for one of the selected potential stations. Server 12 monitors the level of commitments for each selected potential station and in a step 118, outputs a message to the operator of server 12 when commitments to invest in one of the selected potential stations reaches a predetermined threshold. Step 118 may include displaying the message on a GUI of a display connected to server 12.

In one embodiment, an operator of server 12 may begin constructing the potential stations selected by server 12 as a function of the user preference submissions after step 112. For example, if three potential stations are selected by server 12 submissions as a function of preselected criteria, operator begins constructing all three of the potential stations.

In another embodiment, an operator of server 12 may begin constructing one of the potential stations selected by server 12 as a function of the user preference submissions after commitments to invest in the selected potential station reach the predetermined threshold. For example, if three potential stations are selected by server 12 submissions as a function of preselected criteria, but users only commit enough money for constructing one of the stations, then the one station is constructed and the other two stations are not constructed, or at least their construction is postponed until the money committed to constructing one or both of the stations reaches the respective predetermined threshold.

In the preceding specification, the invention has been described with reference to specific exemplary embodiments and examples thereof. It will, however, be evident that various modifications and changes may be made thereto without departing from the broader spirit and scope of invention as set forth in the claims that follow. The specification and drawings are accordingly to be regarded in an illustrative manner rather than a restrictive sense.

What is claimed is:

1. A method for creating an alternative energy vehicle supply station network comprising:
    displaying selectable potential alternative energy vehicle supply stations to users via a graphical user interface displayed on remote devices, the potential alternative energy vehicle supply stations being selectable by each of the users of remote devices to submit at least one preference of each user as a user submission, each of the at least one preference including at least one of the potential alternative energy vehicle supply stations;
    updating a memory of a computer to include the user submissions;
    processing, by a processor of the computer, the user submissions by running the preferences through a model defining preselected criteria stored in the memory and determining which of the potential alternative energy vehicle supply stations satisfy the preselected criteria, the model including a solver for satisfying the preselected criteria by identifying a minimal number of potential alternative energy vehicle supply stations satisfying the potential alternative energy vehicle supply stations in the preferences of each of the users for minimal constructions costs;
    outputting, by the computer, the potential alternative energy vehicle supply stations satisfying the preselected criteria by transmitting the potential alternative energy vehicle supply stations identified by the solver to each of the users to inform the users that the potential alternative energy vehicle supply stations identified by the solver have been selected for construction; and
    constructing at least one of the outputted potential alternative energy supply stations.

2. The method as recited in claim 1 further comprising requesting, by the computer, geographical information via the graphical user interface.

3. The method as recited in claim 2 wherein the displaying selectable potential alternative energy vehicle supply stations includes modifying the graphical user interface in response to the geographical information.

4. The method as recited in claim 1 wherein the outputting includes generating a request that the users submit a commitment regarding the potential alternative energy vehicle supply stations satisfying the preselected criteria.

5. The method as recited in claim 1 wherein the processing the user submissions includes processing, by the processor of the computer, the user submissions as a function of the preselected criteria when the number of user submissions reaches a predetermine value.

6. The method as recited in claim 1 wherein the potential alternative energy vehicle supply stations are electric vehicle battery charging stations.

7. A method for creating an alternative energy vehicle supply station network comprising:
    displaying selectable potential alternative energy vehicle supply stations on to users via graphical user interfaces displayed on remote devices, the potential alternative energy vehicle supply stations being selectable by each of the users of remote devices to submit at least one preference of each user as a user submission, each of the at least one preference including a location and a specified radius each user is willing to drive from the location to use an alternative energy vehicle supply station;
    updating a memory of a computer to include the user submissions;
    processing, by a processor of the computer, the user submissions by running the preferences through a model defining preselected criteria stored in the memory and determining which of the potential alternative energy vehicle supply stations satisfy the preselected criteria, the model configured for satisfying the preselected criteria by identifying a minimal number of potential alternative energy vehicle supply stations within each of the specified radii of the users for minimal constructions costs;
    outputting, by the computer, the potential alternative energy vehicle supply stations satisfying the preselected criteria by transmitting the potential alternative energy vehicle supply stations identified by the model to each of the users to inform the users that the potential alternative energy vehicle supply stations identified by the model have been selected for construction; and
    constructing at least one of the outputted potential alternative energy supply stations.

* * * * *